United States Patent
Kojori et al.

(10) Patent No.: US 7,391,218 B2
(45) Date of Patent: Jun. 24, 2008

(54) METHOD AND APPARATUS FOR GENERALIZED ARC FAULT DETECTION

(75) Inventors: Hassan Ali Kojori, Mississauga (CA); Chunlin Li, Toronto (CA); Francis P. J. Dawson, Woodbridge (CA)

(73) Assignee: Honeywell International Inc., Morristown, NJ (US)

( * ) Notice: Subject to any disclaimer, the term of this patent is extended or adjusted under 35 U.S.C. 154(b) by 108 days.

(21) Appl. No.: 11/350,925

(22) Filed: Feb. 10, 2006

(65) Prior Publication Data
US 2006/0203401 A1 Sep. 14, 2006

Related U.S. Application Data

(60) Provisional application No. 60/660,336, filed on Mar. 11, 2005.

(51) Int. Cl.
*G01R 31/08* (2006.01)
(52) U.S. Cl. .................... 324/520; 324/536; 361/42
(58) Field of Classification Search ............. 324/520, 324/536; 361/42
See application file for complete search history.

(56) References Cited

U.S. PATENT DOCUMENTS

| | | | |
|---|---|---|---|
| 5,047,724 | A | 9/1991 | Boksiner et al. |
| 5,561,605 | A | 10/1996 | Zuercher et al. |
| 5,818,237 | A | 10/1998 | Zuercher et al. |
| 6,128,169 | A | 10/2000 | Neiger et al. |
| 6,300,766 | B1 | 10/2001 | Schmalz |
| 6,362,629 | B1 | 3/2002 | Parker et al. |
| 6,388,849 | B1 | 5/2002 | Rae |
| 6,407,893 | B1 | 6/2002 | Neiger et al. |
| 6,433,978 | B1 | 8/2002 | Neiger et al. |

2001/0033469 A1 * 10/2001 Macbeth et al. ............... 361/42

OTHER PUBLICATIONS

Stjepan Pavljasevic and Francis Dawson, "Phase Synchronization Using Zero Crossing Sampling Digital Phase-Locked Loop", Power Conversion Conference, Osaka, Japan, Apr. 2-5, 2002, vol. II, pp. 665-670.

Stjepan Pavljasevic and Francis Dawson, "Synchronization to Utility Network Signals Containing a High Level of Disturbances", Power Conversion Conference, Osaka, Japan, Apr. 2-5, 2002, vol. III, pp. 1050-1055.

H. Shokrollah Timorabadi, Chunlin Li, F. P. Dawson, "Application of a Fast Synchronization System in Real-Time Power System Monitoring and Control", 22nd Biennial Symposium on Communications, Queen's University, Kingston, May 31-Jun. 3, 2004, pp. 296-298.

Chunlin Li, Francis Dawson, Hassan Kojori, Chris Meyers, Edwin Yue, "Arc Fault Detection and Protection—Opportunities and Challenges", SAE-World Aviation Congress, Montreal, Sep. 8-12, 2003, No. 2003-01-3037.

"Robust Features Selection Scheme for Fault Diagnosis in an Electric Power Distribution System," Butler et al., Canadian Conference on Vancouver, BC, Sep. 14-17, 1993, New York, NY, IEEE pp. 209-213.

Momoh, J. A. et al., "Design and Analysis of Aerospace DC Arcing Faults using Fast Fourier Transformation and Artificial Neural Network," 2003 IEEE Power Engineering Society General Meeting; Conference Proceedings; Toronto, Ontario, Canada, Jul. 13-17, 2003, IEEE Power Engineering Society, New York, NY; IEEE vol. 4 of 4, 2003, pp. 788-793.

* cited by examiner

*Primary Examiner*—Vincent Q Nguyen
(74) *Attorney, Agent, or Firm*—Oral Caglar, Esq.

(57) ABSTRACT

A method and an apparatus detect series and/or parallel arc faults in AC and DC systems. The method according to one embodiment inputs an AC current signal; extracts a fundamental component of the AC current signal and monitoring an amplitude variation profile for the fundamental component, thereby generating a first arc fault detection measure; detects non-stationary changes in the AC current signal applying at least one measure of order higher than one, thereby generating a second arc fault detection measure; and determines whether an arc fault exists based on the first arc fault detection measure and the second arc fault detection measure.

26 Claims, 9 Drawing Sheets

METHOD AND APPARATUS FOR GENERALIZED ARC FAULT DETECTION

CROSS REFERENCE TO RELATED APPLICATION

The present application claims priority under 35 U.S.C. §119(e) of U.S. Provisional Application No. 60/660,336 filed Mar. 11, 2005, the entire contents of which are herein incorporated by reference in their entirety.

BACKGROUND OF THE INVENTION

1. Field of the Invention

The present invention relates to electric power distribution systems, and more particularly to a method and apparatus for detecting series and/or parallel arc faults for electric power systems.

2. Description of the Related Art

Electrical systems used in complex environments such as aerospace systems, industrial environments, vehicles, and residential environments include a large number of electrical circuits, devices, and wires. Arc faults may occur in any of the electrical circuits, or along the wires. If not detected promptly, arc faults may cause short circuits, malfunctions, and fires in the equipment serviced by the electrical circuits or wires exhibiting arc faults.

Arc fault detection and protection pose a significant challenge in such complex environments. Correct and prompt arc fault detection and protection are critical in aircraft environments. Airlines, aircraft manufacturers, the military, and regulatory agencies such as the FAA have expressed the need for accurate and fast arc fault detection and protection systems. A generalized method and system that can reliably detect and prevent series and/or parallel arcs in both AC and DC electric power systems is needed.

Prior art methods have focused research and technology development efforts mostly on the detection of parallel arc faults. Parallel arc faults exhibit high energy levels and are easy to differentiate from other operating conditions. In contrast, series arc fault currents have low energy levels, being limited in magnitude by the electrical load along which they occur. Hence, series arc faults are more difficult to detect. Conventional circuit breakers, currently in widespread use in the aerospace and general residential and industrial environments, are designed to detect only over-current and overload conditions. Numerous serious or fatal electrical incidents are caused by low energy level arc fault conditions resulting from damaged or aging wire. Such low energy level arc faults are not typically detected by conventional circuit breakers.

The aging of wire systems is recognized as a significant safety concern in commercial aviation. Aging wires are a source of arc faults. The problem of aging wire systems extends to virtually all electrical systems in homes and other buildings, consumer products, nuclear power plants, public transit systems, and railroad systems.

Currently there are no systematic means to distinguish a series arc signal from normal and abnormal transient signals, or from various load profiles that occur in a typical AC or DC power distribution system. The existing arc fault detection approaches use a combination of filtering and threshold detection to distinguish such arcs from normal signal occurrences. Such methods are not universal, and are susceptible to frequent nuisance trips. The choice of filtering strategy depends on the nature of the distribution network environment and on the characteristics of the load. However, the nature of the distribution network environment and the characteristics of the loads in an electrical environment may not necessarily be known at the time when generalized libraries are created, such libraries being used to differentiate between arc faults and normal/abnormal transient characteristics of the loads.

A few publications have studied arc detection techniques for electrical power systems. One such technique is described in U.S. Pat. No. 5,561,605, entitled "Arc Detection Using Current Variation". In the technique described in this work, notch filters are used to remove the fundamental and harmonic components from an AC line current and voltage. The resultant signal (current or voltage) is subtracted from the value obtained from a previous period. Normally this difference signal is zero, however, under certain arc fault conditions, the difference can be non-zero. The absolute value of the difference signal is used to create a pulse train whose frequency depends on the magnitude of the error signal. A pulse count is accumulated in a synchronous summer over a predefined time. A trip signal is generated if the accumulated pulse count exceeds a specific value over the predefined time. This technique, however, does not detect arc faults with small absolute signatures.

A disclosed embodiment of the application addresses these and other issues by utilizing a generalized arc fault detection system that detects series and parallel arcs in real time in both AC and DC electrical systems; differentiates arc faults from normal loads both in steady state and during normal and abnormal electric power system transients; allows detection of small arc currents in the presence of large load currents; and provides excellent trip-free operation and noise immunity against switching devices and potential cross-talk among adjacent power lines.

SUMMARY OF THE INVENTION

The present invention is directed to a method and an apparatus for detecting series and/or parallel arc faults in an electric system. According to a first aspect of the present invention, a method of detecting series and/or parallel arc faults in an AC system comprises: inputting an AC current signal; extracting a fundamental component of the AC current signal and monitoring an amplitude variation profile for the fundamental component, thereby generating a first arc fault detection measure; detecting non-stationary changes in the AC current signal applying at least one measure of order higher than one, thereby generating a second arc fault detection measure; and determining whether an arc fault exists based on the first arc fault detection measure and the second arc fault detection measure.

According to a second aspect of the present invention, a method of detecting series and/or parallel faults in a DC system comprises: inputting a current signal; extracting a DC component of the current signal and monitoring an amplitude variation profile for the DC component, thereby generating a first arc fault detection measure; detecting non-stationary changes in the current signal applying at least one measure of order higher than one, thereby generating a second arc fault detection measure; and determining whether an arc fault exists based on the first arc fault detection measure and the second arc fault detection measure.

According to a third aspect of the present invention, an apparatus for detecting series and/or parallel arc faults in an AC system comprises: an input unit for inputting an AC current signal; a steady state component analysis unit for extracting a fundamental component of the AC current signal and monitoring an amplitude variation profile for the fundamental component, thereby generating a first arc fault detection measure; a non-steady state component analysis unit for detecting non-stationary changes in the AC current signal applying at least one measure of order higher than one, thereby generating a second arc fault detection measure; and a detection unit for determining whether an arc fault exists based on the first arc fault detection measure and the second arc fault detection measure.

According to a fourth aspect of the present invention, an apparatus for detecting series and/or parallel arc faults in a DC system comprises: an input unit for inputting a current signal; a steady state component analysis unit for extracting a DC component of the current signal and monitoring an amplitude variation profile for the DC component, thereby generating a first arc fault detection measure; a non-steady state component analysis unit for detecting non-stationary changes in the current signal applying at least one measure of order higher than one, thereby generating a second arc fault detection measure; and a detection unit for determining whether an arc fault exists based on the first arc fault detection measure and the second arc fault detection measure.

BRIEF DESCRIPTION OF THE DRAWINGS

Further aspects and advantages of the present invention will become apparent upon reading the following detailed description in conjunction with the accompanying drawings, in which.

DETAILED DESCRIPTION

Figure 1:
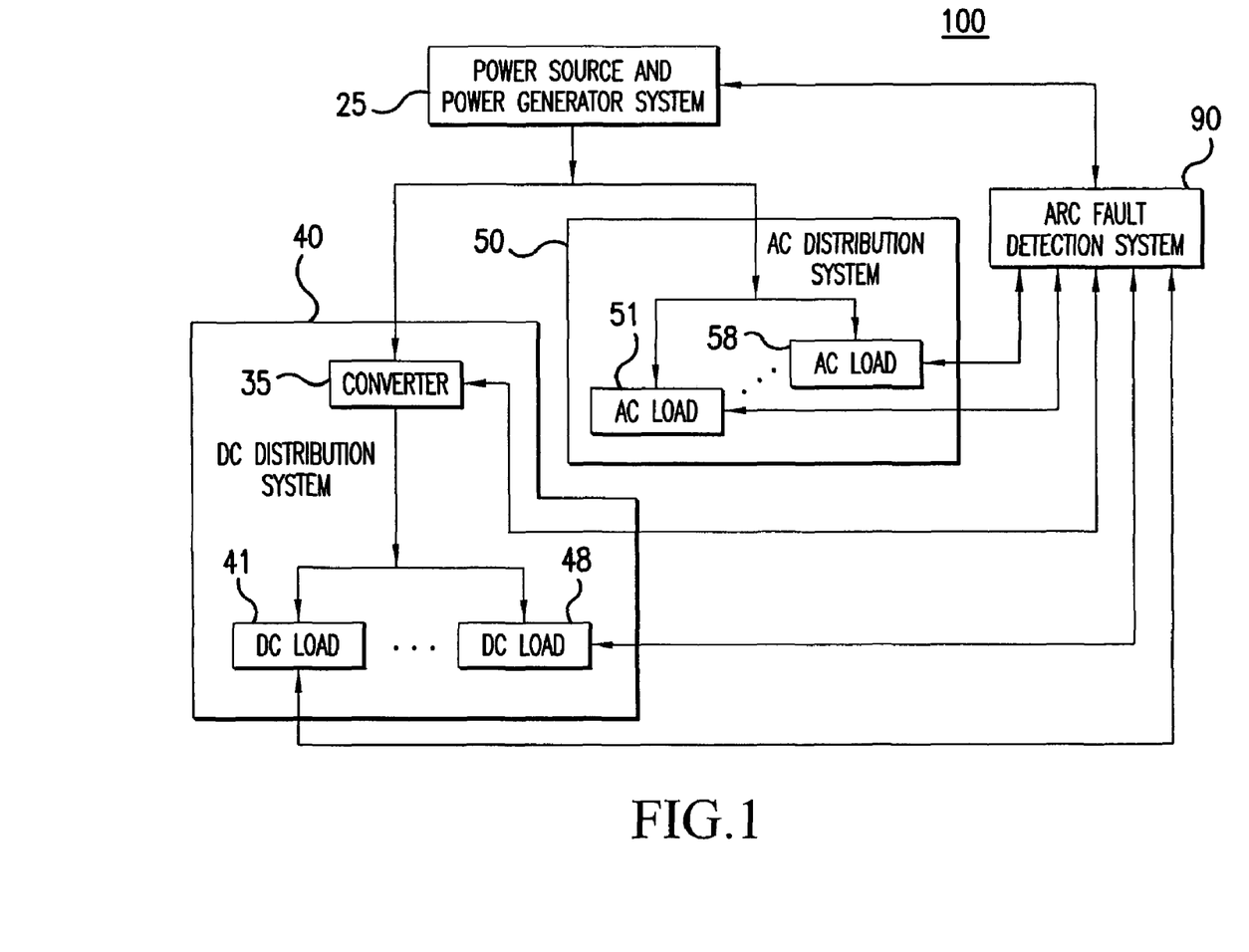
FIG. 1 is a block diagram of an electrical system containing a generalized arc fault detection system according to an embodiment of the present invention.

Aspects of the invention are more specifically set forth in the accompanying description with reference to the appended figures. FIG. 1 is a block diagram of an electrical system containing a generalized arc fault detection system according to an embodiment of the present invention. The electrical system 100 illustrated in FIG. 1 includes the following components: a power source and power generator system 25; a generalized arc fault detection system 90; a DC distribution system 40; and an AC distribution system 50. Operation of the electrical system 100 in FIG. 1 will become apparent from the following discussion.

Electrical system 100 may be associated with an aircraft, a ship, a laboratory facility, an industrial environment, a residential environment, etc. The power source and power generator system 25 transforms power and provides electrical energy in electrical system 100. The power source and power generator system 25 may include a generator of a vehicle, a turbine, a generator for an industrial facility, a motor, etc., as well as electrical circuits and components such as transformers, rectifiers, filters, battery banks, etc. The power source and power generator system 25 may provide high voltages (e.g. 150V) or low voltages (e.g. 28V) to DC distribution system 40 and AC distribution system 50.

DC distribution system 40 receives electric power from power source and power generator system 25, converts the power to DC power using a converter 35, and distributes it to DC loads 41 and 48. Additional DC loads may be included in DC distribution system 40. DC loads are electric circuits using DC power that enable functioning of various services onboard a vehicle, or in a complex environment such as a laboratory facility. AC distribution system 50 receives electric power from power source and power generator system 25, and distributes it to AC loads. AC distribution system 50 includes AC loads 51 and 58. Additional AC loads may be included in AC distribution system 50. AC loads are electric circuits using AC power that enable functioning of various services onboard a vehicle, or in a complex environment such as a laboratory facility. Services using AC and DC power may be an electric motor, an automatic braking system, a lighting system of a vehicle, a piece of industrial equipment, etc.

Generalized arc fault detection system 90 performs arc fault detection for power source and power generator system 25, converter 35, DC loads 41 and 48, and AC loads 51 and 58. Generalized arc fault detection system 90 can detect arcs in electronic components included in power source and power generator system 25, DC distribution system 40 and AC distribution system 50. Fuses, Solid State Power Controllers (SSPCs), arrestors, transorbs, circuit breakers, sensing equipment, circuit interrupters, wires, etc., included in power source and power generator system 25, DC distribution system 40 and AC distribution system 50 can help in arc fault detection.

Although the systems in electrical system 100 are shown as discrete units, it should be recognized that this illustration is for ease of explanation and that the associated functions of certain functional modules can be performed by one or more physical elements.

Figure 2:
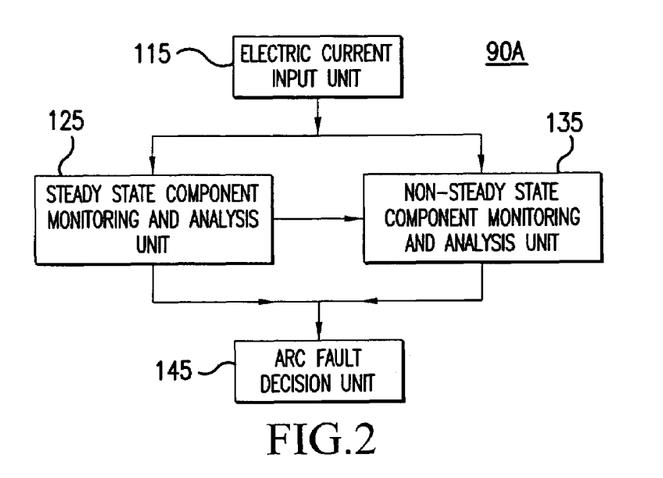
FIG. 2 is a block diagram of a generalized arc fault detection system according to an embodiment of the present invention.

FIG. 2 is a block diagram of a generalized arc fault detection system 90A according to an embodiment of the present invention. Generalized arc fault detection system 90A illustrated in FIG. 2 includes the following components: an electric current input unit 115; a steady state component monitoring and analysis unit 125; a non-steady state component monitoring and analysis unit 135; and an arc fault decision unit 145. Electric current input unit 115 inputs electric currents coming from power source and power generator system 25, DC distribution system 40, and AC distribution system 50. Besides AC and DC currents, AC and DC voltages can also be used by arc fault detection system 90A as additional criteria in detecting arc faults.

Steady state component monitoring and analysis unit 125 receives electric current signals from electric current input unit 115, and extracts, monitors, and analyzes steady state components of the electric current signals received. Non-steady state component monitoring and analysis unit 135 receives electric current signals from electric current input unit 115, and extracts, monitors, and analyzes non-steady state components of the electric current signals received. Non-steady state component monitoring and analysis unit 135 communicates with steady state component monitoring and analysis unit 125 to retrieve information about steady state components, such as the amplitude. Non-steady state component monitoring and analysis unit 135 and steady state component monitoring and analysis unit 125 send results of their analysis of steady state and non-steady state components, to arc fault decision unit 145. Arc fault decision unit 145 detects whether an arc fault has occurred, based on analysis results of steady state and non-steady state components received from steady state component monitoring and analysis unit 125 and non-steady state component monitoring and analysis unit 135. Electric current input unit 115, steady state component monitoring and analysis unit 125, non-steady state component monitoring and analysis unit 135, and arc fault decision unit 145 may include electrical components and circuits, memories, and can be implemented in ASIC, FPGA, with micro-controller, or with DSP technologies.

Figure 3:
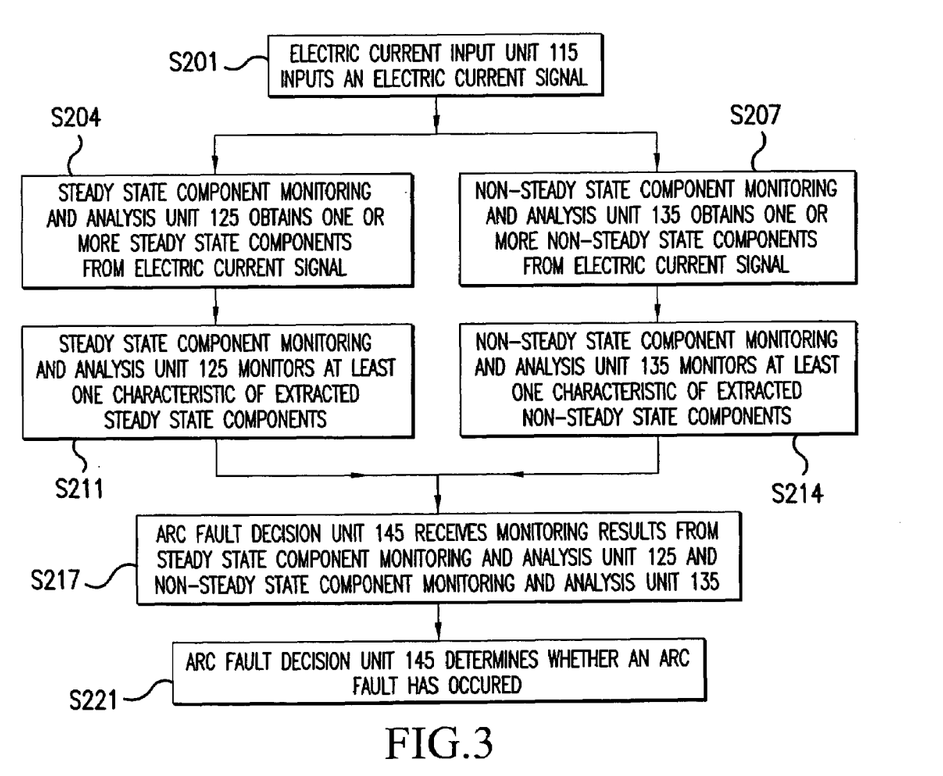
FIG. 3 is a flow diagram illustrating operations performed by a generalized arc fault detection system to detect arc faults according to an embodiment of the present invention illustrated in FIG. 2.

FIG. 3 is a flow diagram illustrating operations performed by a generalized arc fault detection system 90A to detect arc faults according to an embodiment of the present invention illustrated in FIG. 2. Electric current input unit 115 inputs an electric current signal originating in any of the systems included in electrical system 100 (S201). Steady state component monitoring and analysis unit 125 receives the electric current signal and performs operations to obtain steady state components from the electric current signal (S204). Steady state component monitoring and analysis unit 125 next monitors characteristics of the extracted steady state components (S211). Examples of characteristics monitored by steady state component monitoring and analysis unit 125 are physical properties of steady state components, such as amplitude, intensity, etc.

Non-steady state component monitoring and analysis unit 135 also receives the electric current signal. Non-steady state component monitoring and analysis unit 135 performs operations to obtain non-steady state components from the electric current signal (S207). Non-steady state component monitoring and analysis unit 135 monitors characteristics of the extracted non-steady state components (S214). Examples of characteristics monitored by non-steady state component monitoring and analysis unit 135 are physical properties of non-steady state components, such as amplitude, intensity, non-regularity, etc.

Arc fault decision unit 145 receives monitoring results from both steady state component monitoring and analysis unit 125 and non-steady state component monitoring and analysis unit 135 (S217). Based on the monitoring results received, arc fault decision unit 145 determines whether an arc fault has occurred (S221) in the system or sub-system where the initial electric current signal received by electric current input unit 115 originated.

Figure 4:
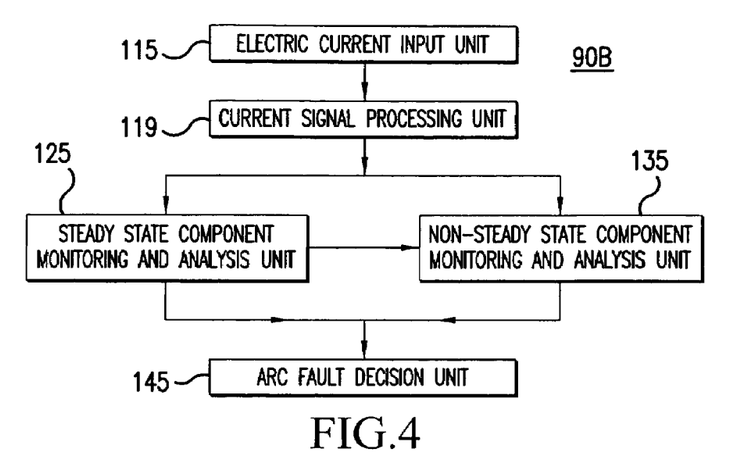
FIG. 4 is a block diagram of a generalized arc fault detection system according to another embodiment of the present invention.

FIG. 4 is a block diagram of a generalized arc fault detection system 90B according to another embodiment of the present invention. Generalized arc fault detection system 90B illustrated in FIG. 4 includes the following components: an electric current input unit 115; a current signal processing unit 119; a steady state component monitoring and analysis unit 125; a non-steady state component monitoring and analysis unit 135; and an arc fault decision unit 145. The components of generalized arc fault detection system 90B in FIG. 4 are similar to the components of generalized arc fault detection system 90A in FIG. 2, with one difference. Generalized arc fault detection system 90B in FIG. 4 includes an additional component, namely the current signal processing unit 119. Current signal processing unit 119 includes electrical components and circuits.

Electric current input unit 115 inputs electric current signals coming from power source and power generator system 25, DC distribution system 40, and AC distribution system 50. Besides AC and DC currents, AC and DC voltages can also be used by arc fault detection system 90B as additional criteria in detecting arc faults.

The current signal processing unit 119 receives and processes the electric current signals from electric current input unit 115. Current signal processing unit 119 performs various operations on characteristics of electric current signals such as intensity, frequency, amplitude, etc. The processed electric signals are sent by current signal processing unit 119 to steady state component monitoring and analysis unit 125 and non-steady state component monitoring and analysis unit 135.

Steady state component monitoring and analysis unit 125 receives the processed electric current signals from current signal processing unit 119, and extracts, monitors, and analyzes steady state components of the received signals. Non-steady state component monitoring and analysis unit 135 receives the processed electric current signals from current signal processing unit 119, and extracts, monitors, and analyzes non-steady state components of the received signals. Non-steady state component monitoring and analysis unit 135 communicates with steady state component monitoring and analysis unit 125 to retrieve information about steady-state components, such as amplitude. Non-steady state component monitoring and analysis unit 135 and steady state component monitoring and analysis unit 125 send results of their analysis of steady state and non-steady state components, to arc fault decision unit 145.

Arc fault decision unit 145 detects whether an arc fault has occurred, based on analysis results of steady state and non-steady state components received from steady state component monitoring and analysis unit 125 and non-steady state component monitoring and analysis unit 135.

Figure 5A:
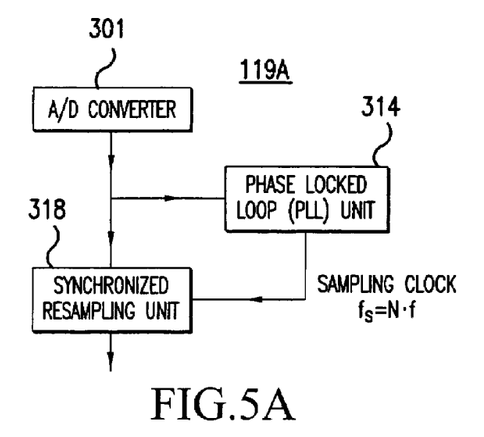
FIG. 5A is a block diagram of a current signal processing unit included in a generalized arc fault detection system according to an embodiment of the present invention illustrated in FIG. 4.

FIG. 5A is a block diagram of a current signal processing unit 119A included in a generalized arc fault detection system 90B according to an embodiment of the present invention illustrated in FIG. 4. Current signal processing unit 119A includes the following components: an A/D converter 301; a phase locked loop (PLL) unit 314; and a synchronized resampling unit 318. A/D converter 301 converts analog electric signals to digital electric signals. A/D converter 301 includes physical electronic components of A/D converters, such as resistors, transistors, integrated circuits, etc.

The power frequency used in complex modern environments such as the aerospace environment is always changing. The typical range of power frequencies used in aerospace environments is usually between 350 Hz and 800 Hz. To achieve accurate calculations and proper operation of circuits servicing such complex environments, filtering techniques such as the Fourier Transform preferably employ either frequency adaptive algorithms that employ transfer function coefficient adaptation, or synchronized sampling.

Frequency adaptive algorithms are based on a technique where the coefficients of the transfer function/filter coefficients are changed as the fundamental frequency changes. Changing the coefficients of the transfer function represents a software intensive calculation process, which consumes valuable resources leaving no time for the processor to perform other tasks. Frequency adaptive algorithms are designed on a heuristic basis and thus their performance under a variety of operating conditions is difficult to quantify. Frequency adaptation response times are typically slow, to avoid instability problems in the electrical circuits serviced. Hence, the implementation of frequency adaptive algorithms becomes impractical as the order of circuit transfer functions increases.

Synchronized sampling does not suffer from the drawbacks of frequency adaptive algorithms. Synchronized sampling can be implemented by using a phase locked loop (PLL), which is a closed-loop feedback control system that maintains a constant sampling clock frequency to fundamental frequency ratio, so that the filter coefficients can be preset in advance. Phase-locked loop (PLL) based synchronization algorithms described in publications "Synchronization to Utility Network Signals Containing a High Level of Disturbances", Power Conversion Conference, Osaka, Japan, Apr. 2-5 2002, Vol. III, pp. 1050-1055, and "Phase Synchronization Using Zero Crossing Sampling Digital Phase-Locked Loop," Power Conversion Conference, Osaka, Japan, Apr. 2-5, 2002, Vol. II, pp. 665-670, both by S. Pavljasevic, F. P. Dawson, publications which are herein incorporated by reference, may be used to implement PLL algorithms in the current invention.

FIG. 5A shows an implementation of the PLL based synchronous sampling technique. Phase locked loop (PLL) unit 314 and synchronized resampling unit 318 perform frequency adaptation operations on electric current signals. Phase locked loop unit 314 and synchronized resampling unit 318 may be used when electric currents received by electric current input unit 115 are AC currents whose frequencies need to be changed, modulated, etc. PLL unit 314 generates a sampling frequency $f_s$ that is an integer multiple N of the fundamental frequency f, that is $f_s=Nf$. The sampling clock frequency $f_s$ generated by PLL unit 314 is used to directly control the A/D converter 301, i.e. sampling clock of A/D converter 301 is adapted to $f_s$. Other types of devices or systems that change and/or modulate frequencies of incoming electric signals may also be used. The sampling frequency $f_s$ can be used as an interrupt, so that algorithms of arc fault detection system 90B are executed every time an interrupt request is generated. Synchronized resampling unit 318 may resample the sampling frequency $f_s$. Resampling is needed in case sampling is not done in real time. Real time sampling could be done, for example, using a method that measures the fundamental frequency and adjusts the sampling intervals accordingly. Sampling is not done in real time when, for example, current data is recorded with a fixed frequency that did not account for the fundamental frequency variation. PLL unit 314 and synchronized resampling unit 318 may include resistors, transistors, filters, oscillators, converters, integrated circuits, etc.

The phase locked loop (PLL) technique described herein was verified using a number of data files recorded and can be implemented in an ASIC chip, FPGA, or with a microprocessor-controlled circuit, for real-time arc fault detection. Other physical implementations are possible.

Figure 5B:
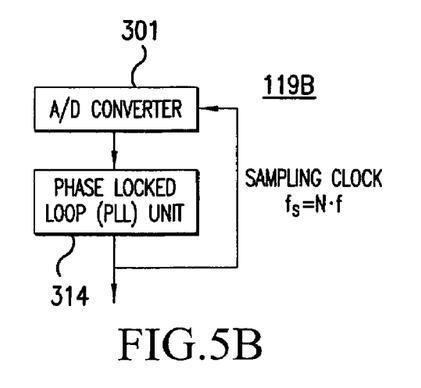
FIG. 5B is a block diagram of an alternative current signal processing unit included in a generalized arc fault detection system according to an embodiment of the present invention illustrated in FIG. 4.

FIG. 5B is a block diagram of an alternative current signal processing unit 119B included in a generalized arc fault detection system 90B according to an embodiment of the present invention illustrated in FIG. 4. FIG. 5B shows another implementation of the PLL based synchronous sampling technique. Current signal processing unit 119B includes the following components: an A/D converter 301; and a phase locked loop (PLL) unit 314. Similar to current signal processing unit 119A illustrated in FIG. 5A, A/D converter 301 included in current signal processing unit 119B converts analog electric signals to digital electric signals, while PLL unit 314 generates a sampling frequency $f_s$ that is an integer multiple N of the fundamental frequency f, that is $f_s=Nf$. The sampling clock of A/D converter 301 is fixed at $1/f_{nominal}$. In FIG. 5B, synchronized re-sampling is realized solely by the algorithm implemented in unit 119B, irrelevant of the clock of the A/D converter 301.

Figure 6:
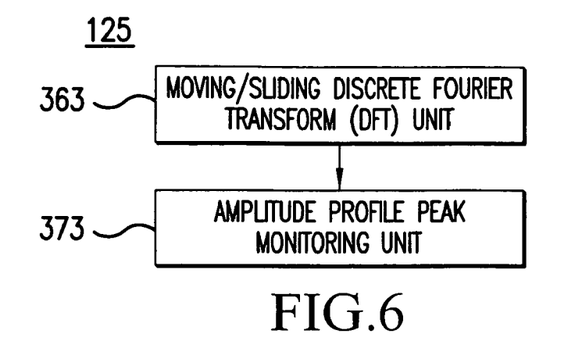
FIG. 6 is a block diagram of a steady state component monitoring and analysis unit included in a generalized arc fault detection system according to an embodiment of the present invention illustrated in FIG. 4.

FIG. 6 is a block diagram of a steady state component monitoring and analysis unit 125 included in a generalized arc fault detection system 90B according to an embodiment of the present invention illustrated in FIG. 4. Steady state component monitoring and analysis unit 125 includes a moving/sliding discrete Fourier transform (MDFT) unit 363 and an amplitude profile peak monitoring unit 373. Moving/sliding discrete Fourier transform unit 363 extracts a steady state component from the electrical current signal received from electric current input unit 115 or current signal processing unit 119. Amplitude profile peak monitoring unit 373 analyzes characteristics of the steady state component extracted by moving/sliding discrete Fourier transform unit 363.

A steady-state component extracted by MDFT unit 363 is the fundamental component of the electrical current signal received. MDFT unit 363 and amplitude profile peak monitoring unit 373 analyze the fundamental component of the electrical current signal in real-time, by tracking fundamental amplitude variations in real-time. For this purpose, maxima in the amplitude of the fundamental component of the electrical current signal are monitored. Peaks of the amplitude profile are determined using changes of slope polarity in the amplitude, from one data sample to the next data sample. A counter may be used by amplitude profile peak monitoring unit 373 to count the peaks. Other devices and systems that extract steady state components from signals, and analyze characteristics of the extracted steady state components can also be used. For example, bandpass filtering could be used instead of MDFT, to track fundamental amplitude variations in real-time.

The fundamental component of an electrical signal contains the largest amount of signal energy in the low frequency domain. A fundamental component of an electrical current signal varies in response to changes produced during an arc fault. For example, the number of fundamental component maxima is different for a current signal fundamental component that includes an arc fault event, when compared to the same current signal fundamental component without an arc fault event. Hence, a criterion for low frequency detection of arc faults used in the current embodiment is monitoring the number of fundamental component maxima in a current signal, within a specific time window.

Moving/sliding discrete Fourier transform (DFT) unit 363 is used to first extract the fundamental component of an electrical current signal in real time. The discrete Fourier transform (DFT) is the standard method for frequency domain analysis using a discretized signal. The DFT is typically realized using a fast Fourier transform (FFT). However, if only one or a few frequency components are extracted from the signal, the moving discrete Fourier transform is an efficient technique for computing a sparse DFT matrix. The moving/sliding discrete Fourier transform (MDFT) has a fast response of only one sample delay.

The principle of the MDFT is known as the DFT shifting theorem or the circular shift property. The DFT shifting theorem holds that if the DFT of a windowed time-domain sequence is X(k), then the DFT of that time-domain sequence, circularly shifted by one sample, is $$X(k)e^{\frac{j2\pi k}{N}}.$$

Thus, the spectral components of a shifted time sequence are the original (unshifted) spectral components of the time-domain sequence, multiplied by $$e^{\frac{j2\pi k}{N}},$$

where k is the DFT bin of interest. This spectral component calculation process can be expressed by the recursive equation:

$$S_k(n) = S_k(n-1)e^{\frac{j2\pi k}{N}} - x(n-N) + x(n) \quad (1)$$

where Sk(n) is the new spectral component and Sk(n-1) is the previous spectral component. The subscript "k" indicates the $k^{th}$ DFT bin.

For the fundamental component, k is equal to one, and equation (1) becomes:

$$S_1(n) = S_1(n-1)e^{\frac{j2\pi}{N}} - x(n-N) + x(n) \quad (2)$$

which is the equation used in the moving/sliding DFT unit 363.

Once moving/sliding DFT unit 363 has extracted the fundamental component of an electrical current signal and calculated the amplitude profile of the fundamental component in real-time, amplitude profile peak monitoring unit 373 counts the number of maxima in the fundamental component amplitude in a selected time window/interval. This method is used as a first criterion for arc fault detection.

This arc fault detection criterion is based on the slow variation of a steady-state component, such as the fundamental component of a signal that is free of arc fault signatures. The load current amplitude variations of an electrical current signal for example, are comparatively slow with respect to the fundamental component period. Under normal no-arc fault conditions, there are almost no significant changes from sample to sample, or even from period to period, in the fundamental amplitude of most practical loads. However, when a parallel and/or series arc fault occurs, unusual behavior appears in the fundamental amplitude of an electrical current signal. Such unusual behavior includes sudden changes of the current amplitude that may occur randomly even within a fundamental period.

Figure 7:
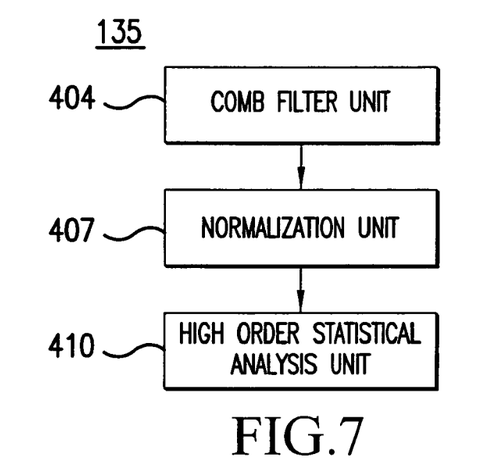
FIG. 7 is a block diagram of a non-steady state component monitoring and analysis unit included in a generalized arc fault detection system according to an embodiment of the present invention illustrated in FIG. 4.

FIG. 7 is a block diagram of a non-steady state component monitoring and analysis unit 135 included in a generalized arc fault detection system 90B according to an embodiment of the present invention illustrated in FIG. 4. Non-steady state component monitoring and analysis unit 135 includes the following components: a comb filter unit 404; a normalization unit 407; and a high order statistical analysis unit 410.

Comb filter unit 404, normalization unit 407, and high order statistical analysis unit 410 perform wide band non-stationary signal analysis. The spectrum of a signal generated by an arc fault contains wideband and non-stationary signals. These arc fault signals are superimposed to electrical system 100 currents that originate in the circuits where the arc fault occurs. Such a current signal is received by non-steady state component monitoring and analysis unit 135, from current signal processing unit 119. The current signal is first filtered by a comb filter included in comb filter unit 404, to remove steady state fundamental and harmonic components, as well as any DC components. Other devices/systems that remove steady-state components from the current signal received from electric current input unit 115 or current signal processing unit 119 may also be used. For example, FIR or IIR filters can be used to eliminate fundamental and harmonic components.

Normalization unit 407 normalizes the resulting filtered current signal, by dividing the filtered signal by the amplitude of the fundamental component. Normalization increases the dynamic range of the filtered signal.

High order statistical analysis unit 410 uses high order statistics to detect non-stationary changes such as transients, time varying inter-harmonics and wideband higher frequency components, in the normalized signal output by normalization unit 407. High order statistical analysis unit 410 is implemented in an ASIC chip, FPGA, or using a microprocessor. High order statistical analysis unit 410 uses high order statistics metrics. Skewness and kurtosis are used by high order statistical analysis unit 410, because skewness and kurtosis are the high order statistic metrics most sensitive to the non-stationary aspect of an arc signal. Other techniques may also be used to evaluate the randomness of an arc signal. High Order Spectral (HOS) technique is an example of an alternative technique that can be used to evaluate the randomness of an arc signal.

The comb filter included in comb filter unit 404 removes steady state components from an electric signal, by suppressing the fundamental and the harmonic components. Comb filter unit 404 allows transients, inter-harmonics and high frequency noise to pass. For exemplification purposes, consider an electrical signal $$x(t) = s(t) + \sum_{b=1}^{N} A_k \sin(k\omega_0 t + \phi_k) \quad (3)$$
$$= s(t) + I(t)$$

In equation (3), s(t) contains high frequency noise and inter-harmonic components, while I(t) contains sinusoidal components for fundamental and harmonic components. An ideal comb filter function in the frequency domain can be specified by the following equation $$H(j\omega) = \begin{cases} 0 & \omega = k\omega_0, k = 1... N \\ 1 & \text{otherwise} \end{cases} \quad (4)$$

When the comb filter with the transfer function described in equation (4) is applied to the electrical signal described in equation (3), all the fundamental and harmonic components I(t) are eliminated. Only non-steady state components s(t) are output by comb filter unit 404 and used for post processing.

A comb filter can also be represented in the time domain using the equation below:

$$y(n)=a_0 y(n-N)+a_1 x(n)-a_2 x(n-N) \quad (5)$$

In equation (5), N is the total number of samples per period, and a0, a1 and a2 are comb filter coefficients which determine the filter characteristics. The choice of values for filter coefficients a0, a1 and a2 is not critical.

The signals of interest in the electrical current signal output by comb filter unit 404 are inter-harmonics, transients, stochastic noise, wide band noise and 1/f noise. While high frequency noise may be independent of the load current magnitude, inter-harmonics and transients are generated mostly by sudden load changes. Normalization unit 407 normalizes the output signal from comb filter unit 404 with respect to the fundamental current component. Normalization can reduce the impact of steady state load currents, and makes the technique suitable for both low and high current levels, thus allowing for a larger dynamic range. In one implementation, a scaling factor of 0.1 was used in normalization.

After normalization of the filtered electrical current signal, high order statistical analysis unit 410 detects transients, inter-harmonics and high frequency component variations. High order statistical analysis unit 410 uses the statistical metrics of skewness and kurtosis, since these metrics are most sensitive to the non-stationary aspect of an arc signal.

Skewness is a measure of symmetry, or more precisely, of lack of symmetry in a set of data. A distribution or data set is symmetric if it looks the same to the left and right of the center point. For a univariate data set $Y_1, Y_2, ..., Y_N$, the formula for skewness is:

$$\text{skewness} = \frac{\sum_{i=1}^{N}(Y_i - \bar{Y})^3}{(N-1)s^3} \quad (6)$$

where $\bar{Y}$ is the mean of the univariate data set, s is the standard deviation of the data set, and N is the number of data points in the data set. The mean is the sum of the data points divided by the number of data points. A data set with a normal distribution has a skewness of zero, and a data set with symmetric data has a skewness close to zero. Negative skewness values indicate that the data in the data set is skewed left. Positive skewness values indicate that the data in the data set is skewed right. A data set skewed left has the left tail heavier than the right tail. Similarly, a data set skewed right has the right tail heavier than the left tail.

Kurtosis is a statistical measure that detects whether the data is peaked or flat relative to a normal distribution. Data sets with high kurtosis have a distinct peak near the mean, decline rather rapidly, and have heavy tails. Data sets with low kurtosis have a flat top near the mean, rather than a sharp peak. A uniform distribution is an extreme case of the latter. For a univariate data set $Y_1, Y_2, ..., Y_N$, the formula for kurtosis is given by the following formula:

$$\text{kurtosis} = \frac{\sum_{i=1}^{N}(Y_i - \bar{Y})^4}{(N-1)s^4} \quad (7)$$

In equation (7) $\bar{Y}$ is the mean of the data set, s is the standard deviation of the data set, and N is the number of data points in the data set.

High order statistical analysis unit 410 uses a window length that corresponds to one period of the fundamental period, for AC electric current signals. The fundamental period is determined by the phase locked loop unit 314. The number of input samples per period is an integer that the user can select. In one implementation, 256 samples are input per period. The samples come from the filtered normalized signal received from normalization unit 407. High order statistical analysis unit 410 then calculates the skewness and the kurtosis of the data set in one widow length. Skewness reflects the symmetry of the waveforms in a period, while kurtosis reflects the variation trend in the waveform profiles.

Figure 8:
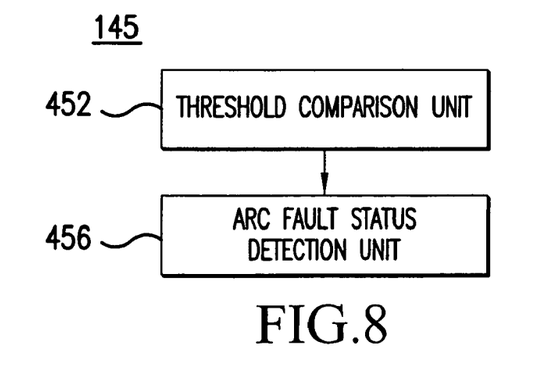
FIG. 8 is a block diagram of an arc fault decision unit included in a generalized arc fault detection system according to an embodiment of the present invention illustrated in FIG. 4.

FIG. 8 is a block diagram of an arc fault decision unit 145 included in a generalized arc fault detection system 90B according to an embodiment of the present invention illustrated in FIG. 4. Arc fault decision unit 145 includes a threshold comparison unit 452 and an arc fault status detection unit 456. Threshold comparison unit 452 compares outputs from steady state component monitoring and analysis unit 125 and non-steady state component monitoring and analysis unit 135 to predetermined thresholds. Such thresholds are selected such that surveyed signal properties for signals with arc fault signatures will exceed the thresholds, while surveyed signal properties for signals without arc fault signatures will be below the thresholds.

For the steady state component monitoring and analysis unit 125 illustrated in FIG. 6, the number of maxima in the amplitude of the fundamental component is counted by amplitude profile peak monitoring unit 373 and is compared to a predetermined threshold in threshold comparison unit 452. For the non-steady state component monitoring and analysis unit 135 illustrated in FIG. 7, the skewness and kurtosis of a filtered data set are calculated by the high order statistical analysis unit 410 and are compared to predetermined thresholds in threshold comparison unit 452. Skewness and kurtosis of a signal without an arc fault are much smaller than the skewness and kurtosis of a signal including arc faults. A detection output is generated if the number of amplitude maxima exceeds its threshold and the skewness and kurtosis exceed their respective thresholds, in a period window. The technique of weighted integration may also be used to evaluate skewness and kurtosis.

For each instance where threshold comparison unit 452 detects data above thresholds, arc fault status detection unit 456 outputs a report that an arc fault has occurred. All counted parameters (peak amplitude count, skewness, and kurtosis) must be above threshold for an arc fault to be reported. Threshold comparison unit 452 and arc fault status detection unit 456 include electronic devices and circuits, integrated circuits, etc.

Figure 9:
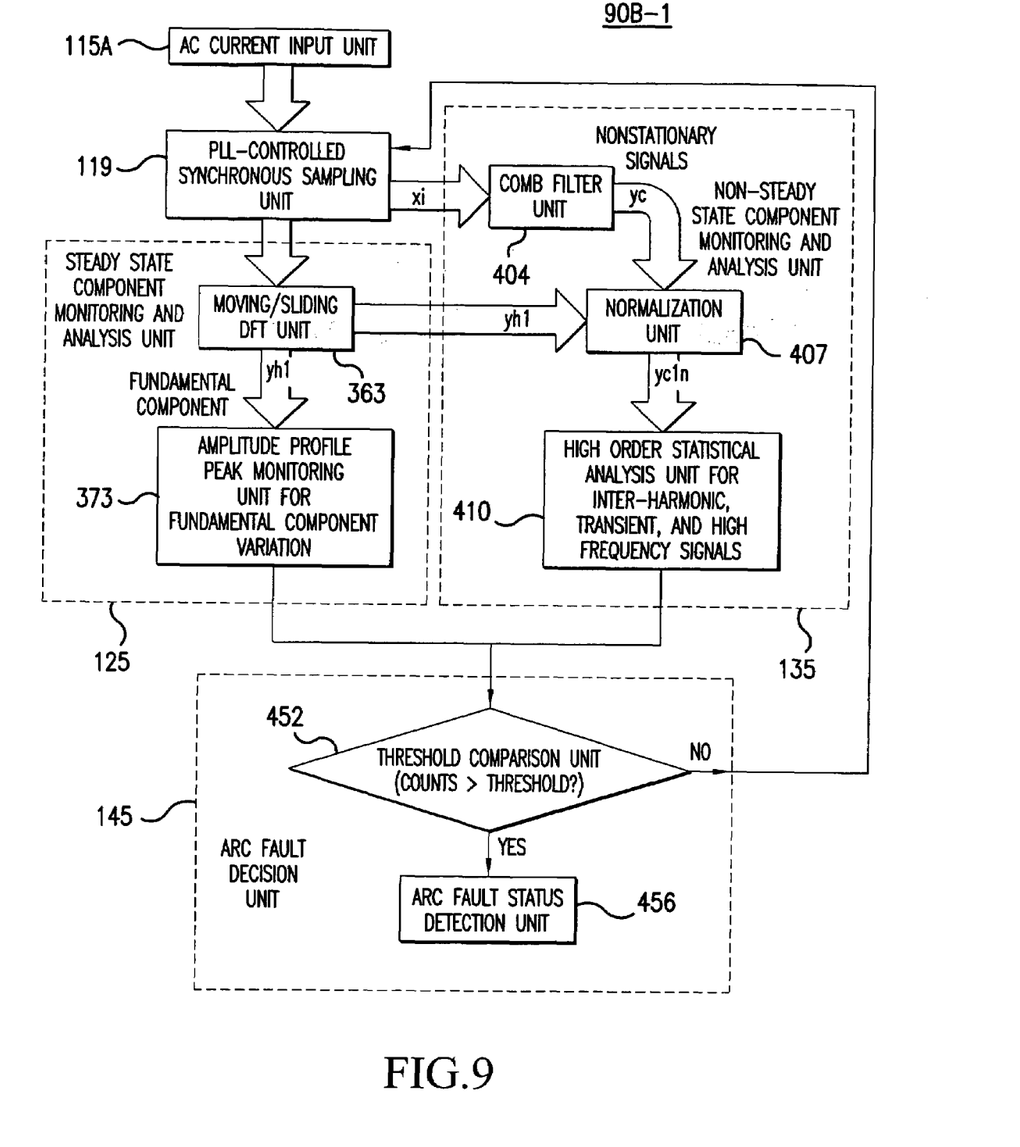
FIG. 9 is a functional block diagram of an exemplary generalized arc fault detection system for an AC system according to an embodiment of the present invention.

FIG. 9 is a functional block diagram of an exemplary generalized arc fault detection system 90B-1 for an AC system according to an embodiment of the present invention. The generalized arc fault detection system 90B-1 in FIG. 9 is used for arc fault detection in a system that generates AC currents, included in electrical system 100. Arc fault detection system 90B-1 includes the following components: an AC current input unit 115A; a PLL-controlled synchronous sampling unit 119; a moving/sliding DFT unit 363; an amplitude profile peak monitoring unit for fundamental component variation 373; a comb filter unit 404; a normalization unit 407; a high order statistical analysis unit for inter-harmonic, transient, and high frequency signals 410; a threshold comparison unit 452; and an arc fault status detection unit 456.

PLL-controlled synchronous sampling unit 119 is a current signal processing unit 119A or 119B, as shown in FIG. 5A or FIG. 5B. Moving/sliding DFT unit 363 and amplitude profile peak monitoring unit for fundamental component variation 373 are included in steady state component monitoring and analysis unit 125. Comb filter unit 404, normalization unit 407, and high order statistical analysis unit for inter-harmonic, transient, and high frequency signals 410 are included in non-steady state component monitoring and analysis unit 135. Threshold comparison unit 452 and arc fault status detection unit 456 are included in arc fault decision unit 145. It should be recognized that the block diagram of FIG. 9 is for ease of explanation, and that physical implementation may be achieved with various hardware/software configurations.

AC current input unit 115A inputs an AC current. PLL-controlled synchronous sampling unit 119 performs analog to digital conversion of the AC current, changes the frequency of the AC current, and sends the resulting signal to moving/sliding DFT unit 363 and comb filter unit 404. PLL-controlled synchronous sampling unit 119 generates a sampling frequency $f_s$ that is an integer multiple N of the fundamental frequency f.

Moving/sliding DFT unit 363 is used to extract and monitor the fundamental component of the AC current signal in real-time. Fast detection of arc faults is achieved. Amplitude profile peak monitoring unit for fundamental component variation 373 counts the number of maxima in the amplitude of the fundamental component.

Comb filter unit 404 and normalization unit 407 are adopted to reduce the effect of the steady state fundamental and harmonic components, and to increase the dynamic range of the signal. Comb filter unit 404 removes the steady state components from the AC current signal received from the PLL-controlled synchronous sampling unit 119. The resulting signal, which includes non-steady state components, is sent to normalization unit 407. Normalization unit 407 communicates with moving/sliding DFT unit 363 and obtains information about the fundamental component of the AC current signal. High order statistical analysis unit for inter-harmonic, transient, and high frequency signals 410 analyzes wide-band non-stationary arc signals.

Amplitude profile peak monitoring unit for fundamental component variation 373 and high order statistical analysis unit for inter-harmonic, transient, and high frequency signals 410 implement two criteria for detection of arc faults in accordance with an embodiment of the present invention. Threshold comparison unit 452 compares outputs from amplitude profile peak monitoring unit for fundamental component variation 373 and high order statistical analysis unit for inter-harmonic, transient, and high frequency signals 410 to predetermined thresholds. When the amplitude profile peak count is larger than its threshold, and the skewness and kurtosis are higher than their thresholds, arc fault status detection unit 456 outputs a report that an arc fault has occurred. The analysis is performed continuously, in real time, for all data arriving in the AC current signal. Threshold comparison unit 452 may implement a resetable counting mechanism.

Figure 10:
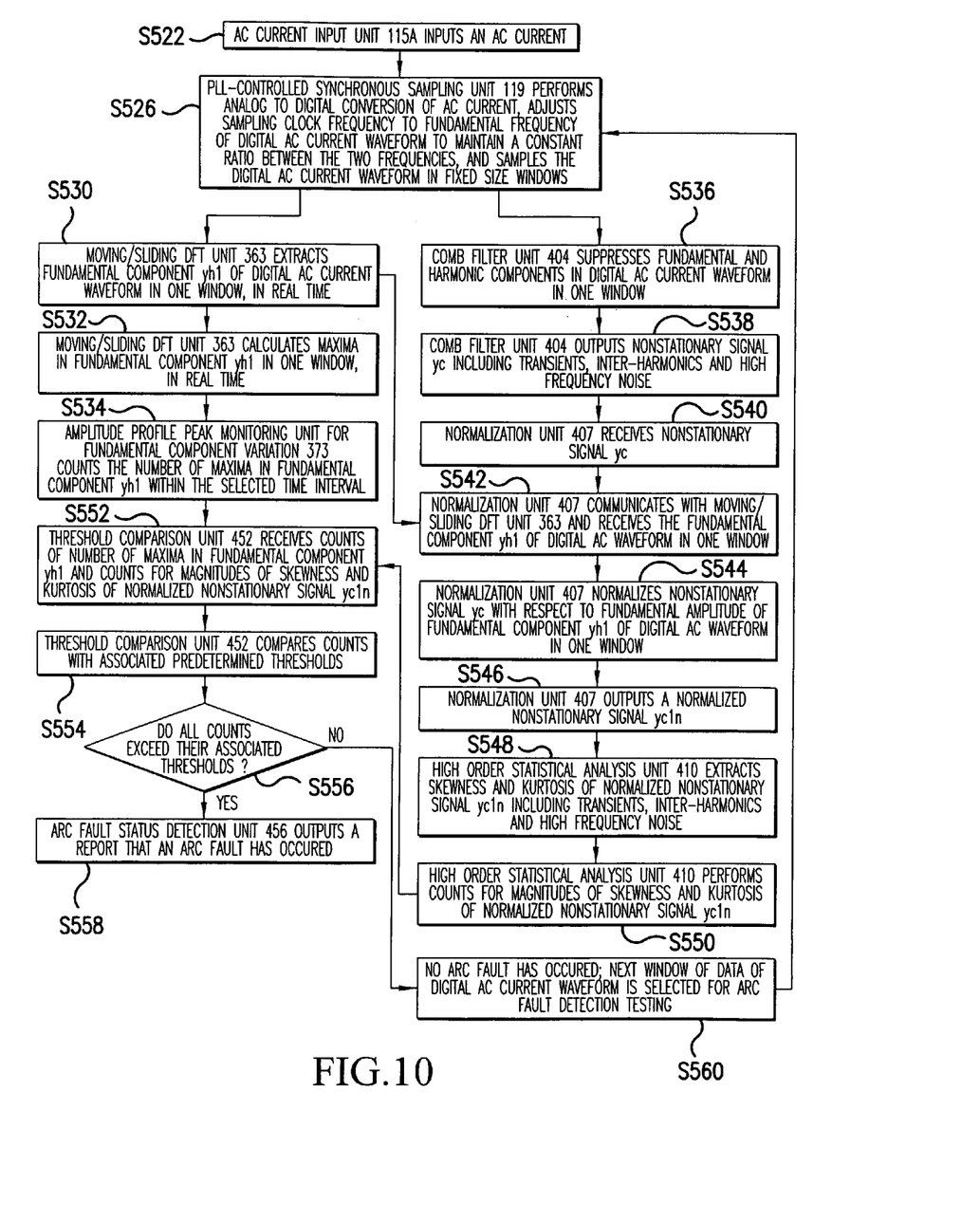
FIG. 10 is a flow diagram illustrating operations performed by an exemplary generalized arc fault detection system to detect arc faults in an AC system according to an embodiment of the present invention illustrated in FIG. 9.

FIG. 10 is a flow diagram illustrating operations performed by a generalized arc fault detection system 90B-1 to detect arc faults in an AC system according to an embodiment of the present invention illustrated in FIG. 9. AC current input unit 115A inputs an AC current (S522). PLL-controlled synchronous sampling unit 119 performs analog to digital conversion of the AC current, adjusts sampling clock frequency to fundamental frequency of digital AC current waveform to maintain a constant ratio between the two frequencies, and samples the digital AC current waveform in fixed-size windows (S526). The length of windows is the width of the sampling period, and the number of current signal samples within each window is maintained constant by PLL-controlled synchronous sampling unit 119.

Moving/sliding DFT unit 363 next extracts fundamental component yh1 from the digital AC current waveform in one window, in real time (S530). Moving/sliding DFT unit 363 calculates maxima in the fundamental component yh1 in real time (S532). Amplitude profile peak monitoring unit for fundamental component variation 373 counts the number of maxima in the fundamental component yh1 within the selected time interval (S534).

Comb filter unit 404 suppresses fundamental and harmonic components in the digital AC current waveform received in one window (S536). Comb filter unit 404 also filters out dc components that may be present in the digital AC current waveform. Comb filter unit 404 outputs a non-stationary signal yc including transients, inter-harmonics and high frequency noise (S538). Normalization unit 407 receives the non-stationary signal yc (S540), and also communicates with moving/sliding DFT unit 363 to receive the fundamental component yh1 of digital AC waveform (S542). Normalization unit 407 next normalizes the non-stationary signal yc with respect to fundamental amplitude of the fundamental component yh1 of digital AC waveform (S544). Normalization unit 407 outputs a normalized non-stationary signal yc1$n$ (S546). High order statistical analysis unit 410 extracts the skewness and kurtosis of the normalized non-stationary signal yc1$n$ that includes transients, inter-harmonics and high frequency noise (S548). High order statistical analysis unit 410 then performs counts for magnitudes of skewness and kurtosis of normalized non-stationary signal yc1$n$ (S550).

Threshold comparison unit 452 receives counts of number of maxima in fundamental component yh1 and counts for magnitudes of skewness and kurtosis of normalized non-stationary signal yc1$n$ (S552). Threshold comparison unit 452 next compares the received counts with associated predetermined thresholds (S554). For this purpose, threshold comparison unit 452 performs a test to determine whether all the counts exceed their associated thresholds (S556). If the answer is yes, that is, if all the counts exceed their associated thresholds, then arc fault status detection unit 456 outputs a report that an arc fault has occurred (S558). If the answer is no, then no arc fault is reported to have occurred (S560). The next window of data of digital AC current waveform is selected for arc fault detection testing (S560).

If an arcing event exists for a continuous time interval, both the peak amplitude count and the high order statistical metrics violate the threshold conditions. Hence, the arc will be detected. Extensive computer simulations show that this technique can reliably detect AC arcs, whether parallel or series, correctly. Moreover, the extensive computer simulations showed that there were no falsely detected arc fault signals for an extensive number of tested modes of operation and for a wide range of tested types of load profiles.

Figure 11:
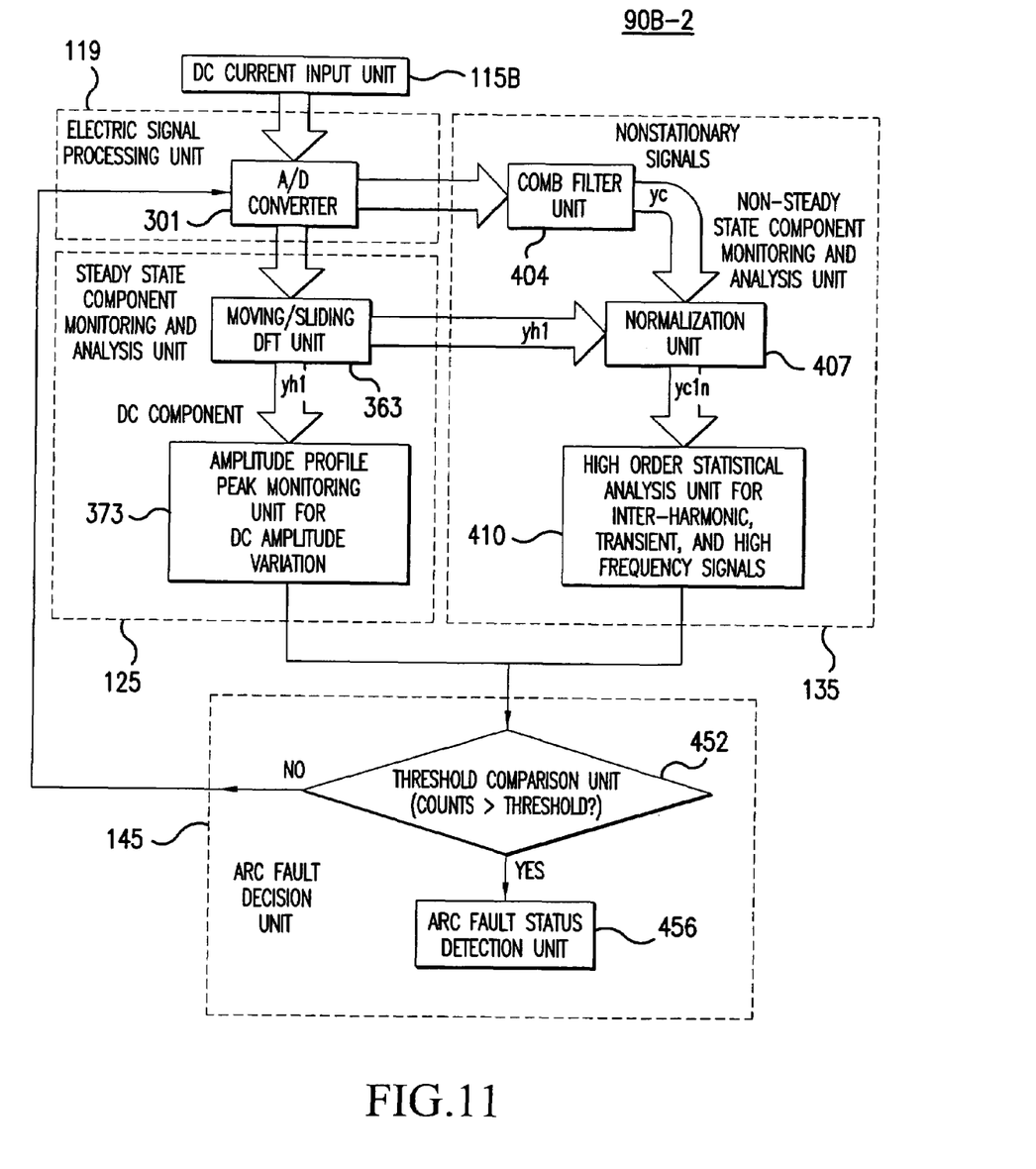
FIG. 11 is a functional block diagram of an exemplary generalized arc fault detection system for a DC system according to an embodiment of the present invention.

FIG. 11 is a functional block diagram of an exemplary generalized arc fault detection system 90B-2 for a DC system according to an embodiment of the present invention. The generalized arc fault detection system 90B-2 in FIG. 11 is used for arc fault detection in a system producing DC currents, included in electrical system 100. Arc fault detection system 90B-2 includes the following components: a DC current input unit 115B; an A/D converter 301; a moving/sliding DFT unit 363; an amplitude profile peak monitoring unit for DC amplitude variation 373; a comb filter unit 404; a normalization unit 407; a high order statistical analysis unit for inter-harmonic, transient, and high frequency signals 410; a threshold comparison unit 452; and an arc fault status detection unit 456.

A/D converter 301 is a current signal processing unit 119 for DC signals. Moving/sliding DFT unit 363 and amplitude profile peak monitoring unit for DC amplitude variation 373 are included in steady state component monitoring and analysis unit 125. Comb filter unit 404, normalization unit 407, and high order statistical analysis unit for inter-harmonic, transient, and high frequency signals 410 are included in non-steady state component monitoring and analysis unit 135. Threshold comparison unit 452 and arc fault status detection unit 456 are included in arc fault decision unit 145. It should be recognized that the block diagram of FIG. 11 is for ease of explanation, and that physical implementation may be achieved with various hardware/software configurations.

A PLL unit 314 is not included in generalized arc fault detection system 90B-2, since for a DC signal there is typically no need for phase locked loop synchronization. One case in which a PLL unit 314 may be used in a generalized arc fault detection system 90B for a DC system is when the DC current signal includes current harmonics generated downstream of a battery. In this case, a PLL unit 314 may be included to implement a sampling frequency that is an integer multiple of the lowest switching frequency component present in the DC signal. Synchronized resampling unit 318 may also be included in this case. If the harmonics are due to a process generated by a generator, the sampling signal may come directly from a gating generator or from a PLL unit 314.

DC current input unit 115B inputs a DC current. A/D converter 301 performs analog to digital conversion of the DC current and sends the resulting signal to moving/sliding DFT unit 363 and comb filter unit 404. Moving/sliding DFT unit 363 is used to extract and monitor the DC component of the DC current for DC arc detection in real-time. Fast detection of arc faults is achieved. Amplitude profile peak monitoring unit for DC amplitude variation 373 counts the number of maxima in the DC amplitude of the current signal.

Comb filter unit 404 and normalization unit 407 are adopted to reduce the effect of the DC component and to increase the signal dynamic range. Comb filter unit 404 removes the DC component from the DC signal received from A/D converter 301. Normalization unit 407 communicates with moving/sliding DFT unit 363 and obtains information about the DC component of the DC signal. High order statistical analysis unit for inter-harmonic, transient, and high frequency signals 410 analyzes wide-band non-stationary arc signals.

Amplitude profile peak monitoring unit for DC amplitude variation 373 and high order statistical analysis unit for inter-harmonic, transient, and high frequency signals 410 implement two criteria for detection of arc faults in accordance with an embodiment of the present invention. Threshold comparison unit 452 compares outputs from amplitude profile peak monitoring unit for DC amplitude variation 373 and high order statistical analysis unit for inter-harmonic, transient, and high frequency signals 410 to predetermined thresholds. When all threshold conditions are not satisfied, arc fault status detection unit 456 outputs a report that an arc fault has occurred. The analysis is performed continuously, in real time, for all data arriving in the DC signal. Threshold comparison unit 452 may implement a resetable counting mechanism.

Figure 12:
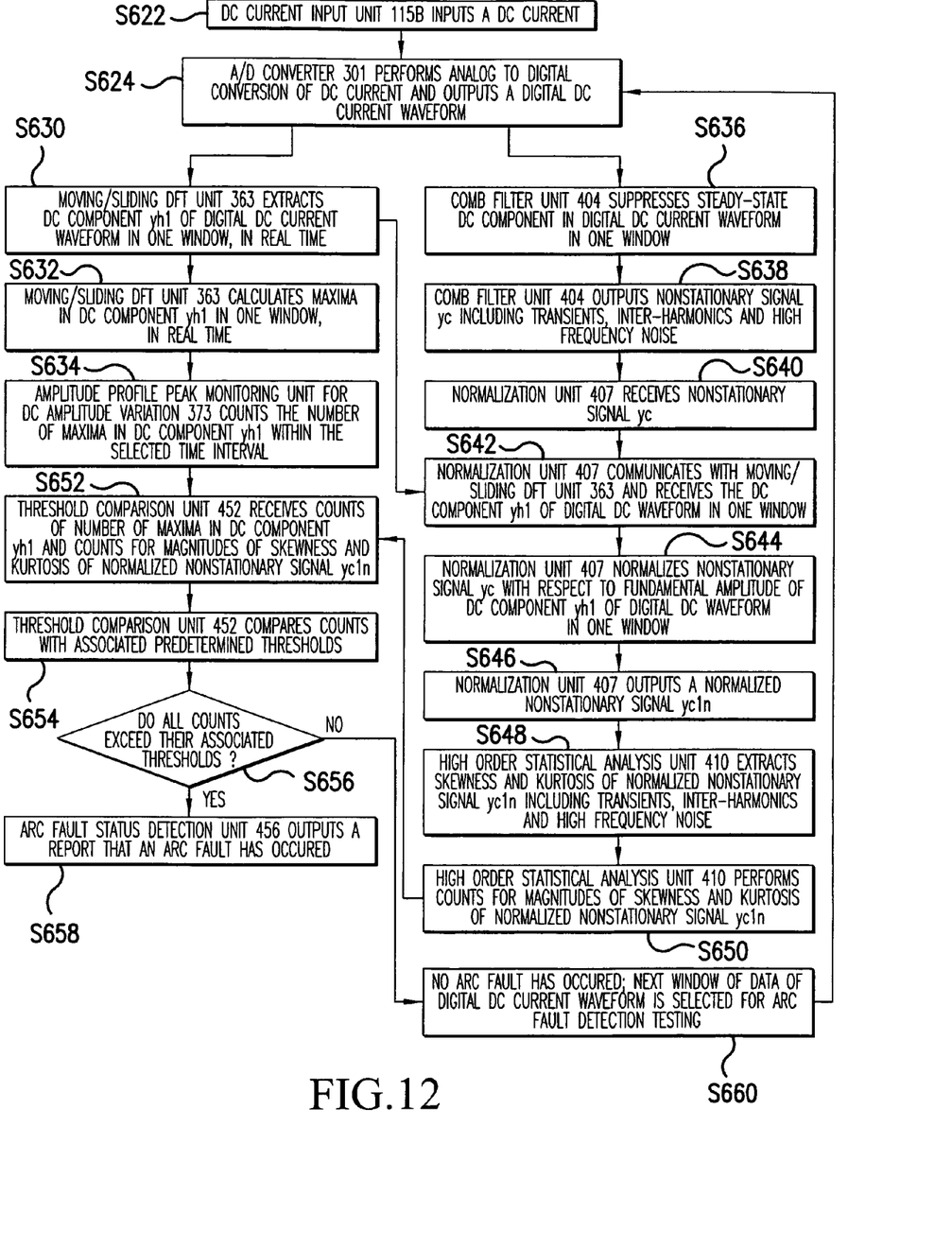
FIG. 12 is a flow diagram illustrating operations performed by an exemplary generalized arc fault detection system to detect arc faults in a DC system according to an embodiment of the present invention illustrated in FIG. 11.

FIG. 12 is a flow diagram illustrating operations performed by an generalized arc fault detection system 90B-2 to detect arc faults in a DC system according to an embodiment of the present invention illustrated in FIG. 11. DC current input unit 115B inputs a DC current (S622). A/D converter 301 performs analog to digital conversion of the DC current and outputs a digital DC current waveform (S624). Moving/sliding DFT unit 363 extracts the DC component $yh1$ of the digital DC current waveform included in one window, in real time (S630). Any window time length can be used for DC arc detection, but it is better to use the same window length as that used for an AC system included in system 100, in order to remove power induced noises. Moving/sliding DFT unit 363 then calculates maxima in the DC component $yh1$ in real time (S632). Amplitude profile peak monitoring unit for DC amplitude variation 373 counts the number of maxima in the DC component $yh1$ within the selected time interval (S634). Comb filter unit 404 suppresses the DC component in the digital DC current waveform included in one window (S636). Comb filter unit 404 outputs a non-stationary signal yc including transients, inter-harmonics and high frequency noise (S638). Normalization unit 407 receives the non-stationary signal yc (S640) and communicates with moving/sliding DFT unit 363 to receive the DC component $yh1$ of the digital DC waveform included in one window (S642). Normalization unit 407 then normalizes the non-stationary signal yc with respect to the amplitude of the DC component $yh1$ of digital DC waveform (S644). Normalization unit 407 outputs a normalized non-stationary signal $yc1n$ (S646). High order statistical analysis unit 410 extracts the skewness and kurtosis of normalized non-stationary signal $yc1n$ including transients, inter-harmonics and high frequency noise (S648). High order statistical analysis unit 410 then performs counts for magnitudes of skewness and kurtosis of normalized non-stationary signal $yc1n$ (S650).

Threshold comparison unit 452 receives counts of number of maxima in the DC component $yh1$ and counts for magnitudes of skewness and kurtosis of normalized non-stationary signal $yc1n$ (S652). Threshold comparison unit 452 compares the received counts with associated predetermined thresholds (S654). For this purpose, threshold comparison unit 452 performs tests to determine whether all of the counts exceeds their associated thresholds (S656). If all the counts exceed their associated thresholds, that is, if the number of maxima in the DC component $yh1$, the skewness and kurtosis all exceed their associated thresholds, then arc fault status detection unit 456 outputs a report that an arc fault has occurred (S658). If not all the counts exceed their associated thresholds, then no arc fault is reported (S660). The next window of data from digital DC current waveform is selected for arc fault detection testing (S660).

Figure 13:
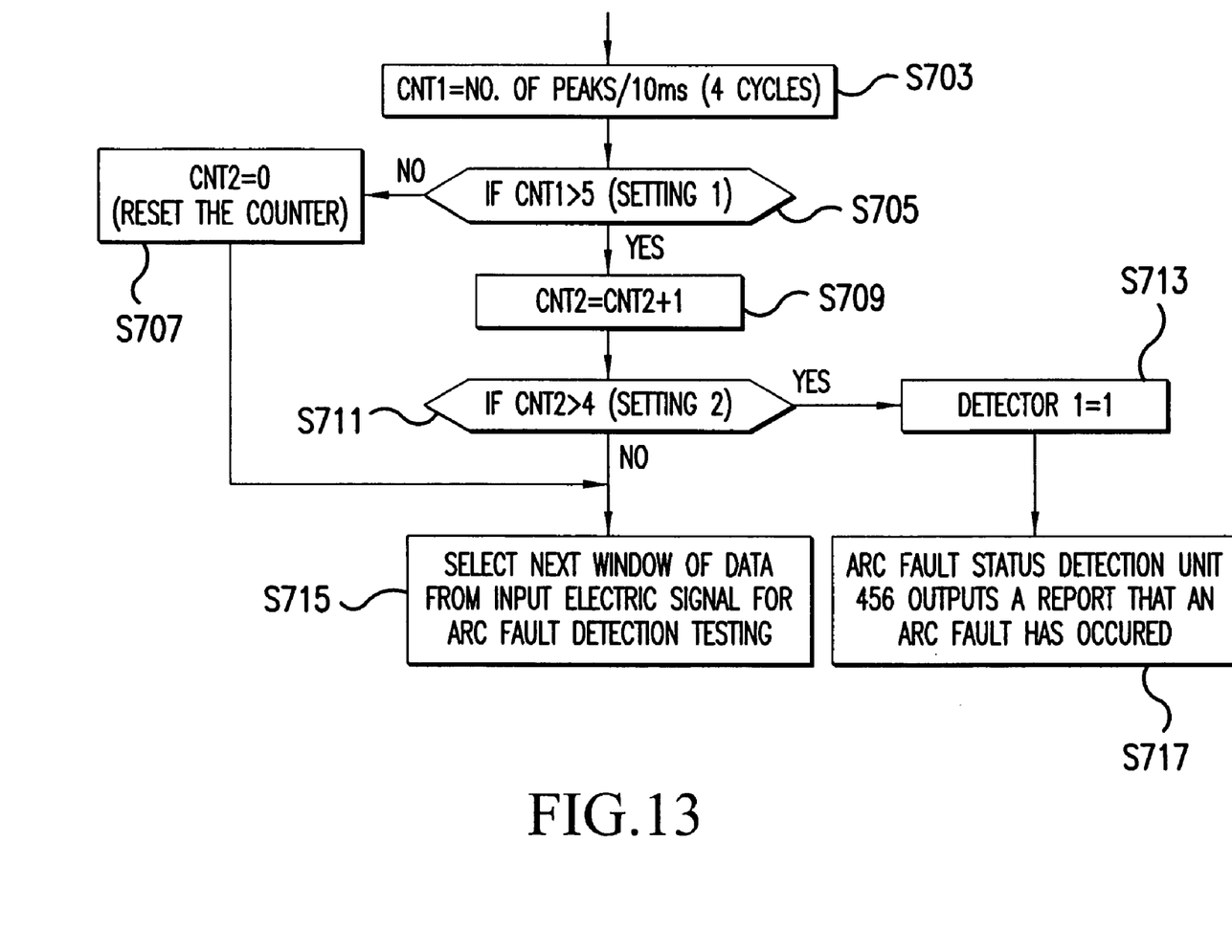
FIG. 13 illustrates a technique for counting maxima in an amplitude profile according to an embodiment of the present invention.

FIG. 13 illustrates a technique for counting maxima in an amplitude profile according to an embodiment of the present invention. The technique illustrated in FIG. 13 is used by threshold comparison unit 452. The technique for counting maxima in an amplitude profile illustrated in FIG. 13 can be used for detecting over-threshold values of the amplitude peak counter for the fundamental component, kurtosis and skewness. The technique for counting maxima in an amplitude profile illustrated in FIG. 13 can be used for DC electric signals as well, where the fundamental component is replaced by the DC component of the DC electric current signal.

Threshold comparison unit 452 receives from amplitude profile peak monitoring unit 373 counts of the number of maxima in the amplitude of the fundamental component of an AC electric current signal. The control "cnt1" calculates the ratio of the number of peaks counted, to 10 ms (S703). 10 ms corresponds to 4 cycles. The value in "cnt1" is compared to 5, which is a setting value used in simulation (S705).

If the value of "cnt1" is not larger than 5 (S705), no arc fault has occurred, and counter cnt2 is set to 0, or reset to 0 if it had a different previous value (S707). The next window of data from the digital AC electric current signal is selected for real-time arc fault detection testing (S715).

If the value of "cnt1" is larger than 5 (S705), an arc fault might have occurred. The value of cnt2 is increased by 1 (S709). For example, if the value of cnt2 was 0 before, when no arcs occurred, the value of cnt2 now becomes 1 (S709). The value of cnt2 is compared to 4, which is a setting value used in simulation (S711). If the value of cnt2 is not larger than 4, it is not yet certain that an arc fault has occurred. The next window of data from the digital AC electric current signal is selected for arc fault detection testing (S715).

The value of cnt2 becomes larger than 4 when the value of cnt1 is larger than 5 in 5 consecutive instances. That is equivalent to the fact that the number of peaks per cycle in the amplitude of the fundamental component is larger than 5 for 5 consecutive cycles. The sustained increase in the number of peaks in the amplitude of the fundamental component is indicative of the fact that an arc fault has indeed occurred, when a similar sustained increase is observed in the skewness and kurtosis as well. In that case, a parameter "detector1" takes the value of 1, to indicate that an arc fault has occurred (S713). The detector1 parameter value is sent to arc fault status detection unit 456, which outputs a report that an arc fault has occurred (S717). The test values for cnt1 and cnt2 are typical setting values that were selected for the simulation. They can be adjusted to provide a suitable tradeoff between speed and accuracy of arc detection.

Embodiments described in the present invention address drawbacks of the prior art. The embodiments described in the present invention provide a new generalized method for detection of series and parallel arcs for both DC and AC electric power systems, and allow reliable and nuisance-free detection of all types of arc faults meeting the following critical Arc Fault Detection and Protection (AFDP) requirements: detect all types of series and parallel arc faults in a timely manner for both AC and DC electric power systems; allow proper AFDP and operation for utility (50/60 Hz), or aerospace Fixed Frequency (400 Hz) or Wide Variable Frequency (360-800 Hz) electric power systems for aerospace environments; differentiate arc faults from normal load currents both in steady state and during normal and abnormal electric power system transients, including in-rush, turn-on and turn-off conditions; allow detection of small arc currents in the presence of large load currents; provide excellent trip-free operation and noise immunity against all types of switching devices and potential cross-talk among adjacent power lines; and do not cause false or nuisance trips due to externally conducted or radiated interference signals.

An AFDP technique according to an embodiment of the present invention utilizes the randomness and stochastic features of arcs to detect arc faults. The prominent signature of arc faults identified in the described embodiments is the existence of a significant asymmetry between the two halves of the fundamental frequency period waveforms of arcing current for AC loads. The irregular repetition of waveforms can be used to discriminate arc faults for both DC and AC systems from various normal/abnormal load characteristics, without the need to include look-up tables or load signature libraries. High Order Statistics (HOS) methods are utilized to effectively evaluate the randomness of arc faults in a real-time or quasi real-time fashion, and reliably detect generalized series or parallel arc faults for AC and/or DC power systems. A PLL and moving DFT can be utilized to extract and monitor fundamental components in real-time for fast arc fault detection. Skewness and kurtosis from HOS can be used to analyze wide-band non-stationary arc signals. Comb filtering and normalization can be used to reduce the effect of steady state fundamental and harmonic components, thereby increasing dynamic signal range.

The arc fault detection technique described in the current invention was verified using a number of data files, and can be implemented in an ASIC chip, FPGA, or microprocessor-controlled circuit, for real-time arc fault detection. Other physical implementations are possible.

In one exemplary implementation, the technique can detect a series arc in 100 ms for a 400 Hz power signal with the given parameters in the simulation.

Although aspects of the present invention have been described in the context of aerospace applications, it should be realized that the principles of the present invention are applicable to other environments.

We claim:

1. A method of detecting series and/or parallel arc faults in an AC or DC system, said method comprising:
   inputting a current signal;
   extracting a component of said current signal and monitoring an amplitude variation profile for said component, thereby generating a first arc fault detection measure;
   detecting non-stationary changes in said current signal by applying at least one statistical or probabilistic based measure of order higher than one, thereby generating a second arc fault detection measure; and
   determining whether an arc fault exists based on said first arc fault detection measure and said second arc fault detection measure.

2. The method of detecting arc faults in an AC or DC system as recited in claim 1, wherein said current signal is an AC current signal, said component is a fundamental component, and said extracting step includes:
   adapting to frequency changes of said AC current signal using a phase locked loop;
   applying a moving/sliding discrete Fourier transform (DFT) to extract said fundamental component of said AC current signal in real time.

3. The method of detecting arc faults in an AC or DC system as recited in claim 1, wherein said current signal is an AC current signal, said component is a fundamental component, and said amplitude variation profile for said component is determined by counting a number of fundamental component maxima within a selected time interval and comparing said number to a threshold.

4. The method of detecting arc faults in an AC or DC system as recited in claim 1, wherein said current signal is an AC current signal, said component is a fundamental component, and said step of detecting non-stationary changes in said AC current signal includes:
   comb filtering said AC current signal to suppress fundamental and harmonic components of said signal; and
   normalizing the result of said comb filtering step with respect to the fundamental amplitude.

5. The method of detecting arc faults in an AC or DC system as recited in claim 1, wherein said step of detecting non-stationary changes in said current signal detects transients, inter-harmonics, and high frequency component variations, and applies high order statistical analysis to measure skewness and kurtosis and detect non-stationary and wide-band changes in said current signal.

6. The method of detecting arc faults in an AC or DC system as recited in claim 1, wherein said component is a DC component of said current signal.

7. The method of detecting arc faults in an AC or DC system as recited in claim 6, further comprising:
applying a moving/sliding discrete Fourier transform (DFT) to extract said DC component of said current signal in real time.

8. The method of detecting arc faults in an AC or DC system as recited in claim 6, wherein said amplitude variation profile for said DC component is determined by counting a number of maxima within a selected time interval and comparing said number to a threshold.

9. The method of detecting arc faults in an AC or DC system as recited in claim 6, wherein said step of detecting non-stationary changes in said current signal includes:
comb filtering said current signal; and
normalizing the result of said comb filtering step.

10. The method of detecting arc faults in an AC or DC system as recited in claim 6, wherein said step of detecting non-stationary changes in said current signal detects transients, inter-harmonics, and high ftecinency component variations, and applies high order statistical analysis to measure skewness and kurtosis and detect non-stationary and wideband changes in said current signal.

11. The method of detecting arc faults in an AC or DC system as recited in claim 1, wherein said statistical or probabilistic based measure of order higher than one is a High Order Spectral measure.

12. The method of detecting arc faults in an AC or DC system as recited in claim 1, wherein said step of detecting non-stationary changes in said current signal applies high order statistical analysis to measure skewness and kurtosis and detect non-stationary and wideband changes in said current signal.

13. An apparatus for detecting series and/or parallel arc faults in an AC or DC system, said apparatus comprising:
an input unit for inputting a current signal;
a steady state component analysis unit for extracting a component of said current signal and monitoring an amplitude variation profile for said component, thereby generating a first arc fault detection measure;
a non-steady state component analysis unit for detecting non-stationary changes in said current signal by applying at least one statistical or probabilistic based measure of order higher than one, thereby generating a second arc fault detection measure; and
a detection unit for determining whether an arc fault exists based on said first arc fault detection measure and said second arc fault detection measure.

14. The apparatus for detecting arc faults in an AC or DC system according to claim 13, wherein said current signal is an AC current signal, said component is a fundamental component of said AC current signal, said steady state component analysis unit extracts said fundamental component of said AC current signal by
adapting to frequency changes of said AC current signal using a phase locked loop; and
applying a moving/sliding discrete Fourier transform (DFT) to extract said fundamental component of said AC current signal in real time.

15. The apparatus for detecting arc faults in an AC or DC system according to claim 13, wherein said current signal is an AC current signal, said component is a fundamental component, and said steady state component analysis unit determines said amplitude variation profile for said fundamental component by counting a number of fundamental component maxima within a selected time interval and comparing said number to a threshold.

16. The apparatus for detecting arc faults in an AC or DC system according to claim 13, wherein said current signal is an AC current signal, said component is a fundamental component, and said non-steady state component analysis unit detects non-stationary changes in said AC current signal by
comb filtering said AC current signal to suppress fundamental and harmonic components of said signal; and
normalizing the result of said comb filtering step with respect to the fundamental amplitude.

17. The apparatus for detecting arc faults in an AC or DC system according to claim 13, wherein said current signal is an AC current signal, said component is a fundamental component, and said non-steady state component analysis unit detects transients, inter-harmonics, and high frequency component variations in said AC current signal, and said non-steady state component analysis unit detects non-stationary changes in said AC current signal by applying high order statistical analysis to measure skewness and kurtosis and detect non-stationary and wideband changes in said AC current signal.

18. The apparatus for detecting arc faults in an AC or DC system according to claim 13, wherein said component is a DC component of said current signal.

19. The apparatus for detecting arc faults in an AC or DC system according to claim 18, wherein said steady state component analysis unit extracts a DC component of said current signal by applying a moving/sliding discrete Fourier transform (DFT) to extract said DC component of said current signal in real time.

20. The apparatus for detecting arc faults in an AC or DC system according to claim 18, wherein said steady state component analysis unit determines said amplitude variation profile for said DC component by counting a number of maxima within a selected time interval and comparing said number to a threshold.

21. The apparatus for detecting arc faults in an AC or DC system according to claim 18, wherein said non-steady state component analysis unit detects non-stationary changes in said current signal by
comb filtering said current signal; and
normalizing the result of said comb filtering step.

22. The apparatus for detecting arc faults in an AC or DC system according to claim 18, wherein said non-steady state component analysis unit
detects transients, inter-harmonics, and high frequency component variations in said current signal, and
detects non-stationary changes in said current signal by applying high order statistical analysis to measure skewness and kurtosis and detect non-stationary and wideband changes in said current signal.

23. The apparatus for detecting arc faults in an AC or DC system according to claim 18, wherein said apparatus is applied in an aerospace power distribution system.

24. The apparatus for detecting arc faults in an AC or DC system according to claim 13, wherein said apparatus is applied in an aerospace power distribution system.

25. The apparatus for detecting arc faults in an AC or DC system according to claim 13, wherein said statistical or probabilistic based measure of order higher than one is a High Order Spectral measure.

26. The apparatus for detecting arc faults in an AC or DC system according to claim 13, wherein said non-steady state component analysis unit detects non-stationary changes in said current signal by applying high order statistical analysis to measure skewness and kurtosis and detect non-stationary and wideband changes in said current signal.

* * * * *